Sept. 18, 1956 L. D. SMULLIN 2,763,777

LOCAL OSCILLATOR MIXER CIRCUIT

Filed Jan. 5, 1946

INVENTOR
LOUIS D. SMULLIN

BY M. A. Hayes

ATTORNEY

United States Patent Office 2,763,777
Patented Sept. 18, 1956

2,763,777

LOCAL OSCILLATOR MIXER CIRCUIT

Louis D. Smullin, Arlington, Mass., assignor, by mesne assignments, to the United States of America as represented by the Secretary of the Navy Application January 5, 1946, Serial No. 639,284

6 Claims. (Cl. 250—20)

This invention relates to local oscillator mixer circuits and more particularly, to a directional coupler for a local oscillator mixer circuit.

In the conventional reactive coupling used between a local oscillator, crystal detector and a high Q reference tuning cavity considerable loss of power is experienced. The power output from the local oscillator is approximately split, half feeding toward the crystal detector and half feeding in the direction of a high Q reference cavity. The amount of attenuation in the line and at the reactive coupling point to the crystal generally required comparatively close coupling for desirable action in the mixer circuit, however, the close reactive coupling required frequently resulted in signal decoupling and the radiation of local oscillator power from the antenna. Further observation indicated that more padding between the local oscillator and the high Q reference cavity were desirable to maintain frequency stability of the local oscillator and the reference cavity in order to have the automatic frequency control function properly. The critical line length between the local oscillator and point of coupling to the crystal for good matching further indicated the undesirability of flexible coaxial line for this purpose.

A principal object of this invention is to provide means for coupling the power output of a local oscillator to a crystal mixer and to a reference cavity.

Another object of this invention is to provide means preventing local oscillator power output from being radiated directly out of the antenna.

A further object of this invention is to provide means for permitting the local oscillator to work into a matched load, thus maintaining better frequency stability.

A still further object of this invention is to provide means of minimizing the interaction of the local oscillator circuit on the received signal.

A still further object of this invention is to provide means for isolating the local oscillator from the reference cavity.

These and other objects will be apparent from the following specification when taken with the accompanying drawings, in which.

Figure 1:
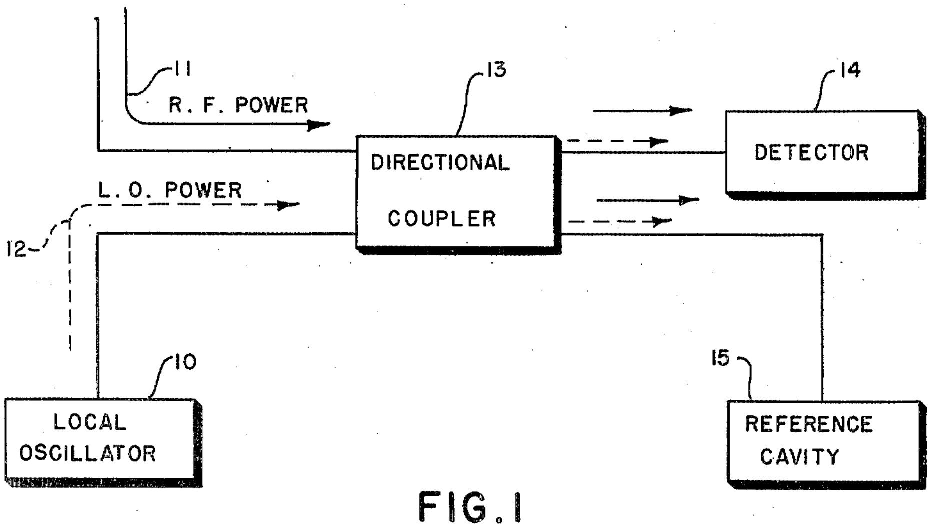
Fig. 1 is a block diagram of the local oscillator mixer circuit.

In Fig. 1 radio frequency (R. F.) power as indicated by arrow 11 and radio frequency power as indicated by arrow 12 from a local oscillator 10 are fed into directional coupler 13. Directional coupler 13 comprising a coupling device and matching pad, effectively couples the necessary local oscillator power 12 to the incoming R. F. power 11 for transmission to detector 14 without decoupling an excessive amount of R. F. power, and provides a means for effectively isolating the local oscillator power 12 from reference cavity 15. As is well known R. F. power from reference cavity 15 is available for automatic frequency control, etc. Further structural and operational characteristics of directional coupler 13 will be discussed in the description of Fig. 2 and reference is now made thereto.

Figure 2:
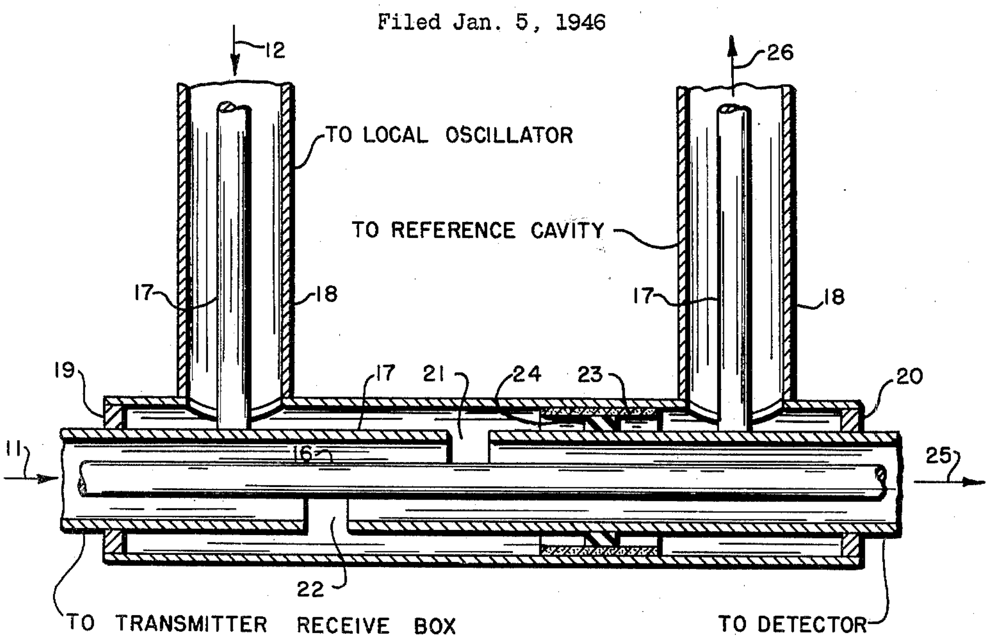
Fig. 2 is an embodiment of the directional coupler illustrated in Fig. 1.

Fig. 2, an embodiment of the invention, represents the directional coupler as adapted for use in a rigid coaxial transmission line, comprising essentially a coaxial transmission line within a coaxial transmission line in which, inner conductor 16 is preferably supported by dielectric beads (not shown) within cylindrical outer conductor 17 of the inner coaxial transmission line. The cylindrical outer conductor 17 of the inner coaxial transmission line becomes also the inner conductor 17 for the outer coaxial transmission line, and is hereinafter referred to as the common cylindrical conductor 17. Cylindrical outer conductor 18 of the outer coaxial transmission line is rigidly and electrically attached to common cylindrical conductor 17 by the annular metallic members 19 and 20.

Radio frequency energy enters the directional coupler as indicated by arrow 11 and is transmitted along the inner coaxial line, comprising inner conductor 16 and common conductor 17, to the detector (not shown). Local oscillator power as indicated by arrow 12 enters and is transmitted along the outer coaxial line comprising common conductor 17 and outer conductor 18. Openings 21 and 22 of predetermined size in the common cylindrical conductor 17 permit coupling of the proper amount of local oscillator power 12 into the transmission line carrying the R. F. power to the detector as indicated by arrow 25. Openings 21 and 22 in common cylindrical conductor 17 are axially spaced with respect to each other substantially one quarter wave length in the line or any odd multiple thereof so that any local oscillator power passing through the openings and back in the direction of the incoming R. F. energy 11, will be out of phase by substantially one half wave length, effectively cancelling each other thus preventing the radiation of local oscillator power from the antenna system.

A matching pad, comprising a polyiron sleeve 23 or other suitable attenuating material, securely fitted and attached to the inner wall of the outer cylindrical conductor 18 and supported by a cylindrical dielectric member 24 of less length securely attached to the inner surface of polyiron sleeve 23 and the outer surface of the common cylindrical conductor 17, provides a matched load for the local oscillator and also a matched load for the reference cavity 15 (Fig. 1) thus effectively isolating each from the other, thereby increasing the frequency stability of both.

That part of the local oscillator power 12 not coupled into the mixer circuit works into matching pad (23 and 24) thus being available as indicated by arrow 26 to a reference cavity.

The invention is equally adaptable to use in wave guide transmission lines.

While there is shown an embodiment of this invention, it will be understood that many modifications may be made without departing from the spirit thereof, and it is contemplated to cover any such modifications as fall within the true spirit and scope of the invention.

What is claimed is:

1. For use with apparatus for receiving radio frequency energy, a local oscillator mixer circuit for a guided wave transmission line comprising, a local oscillator, a directive coupler, and a detector, the output power of said local oscillator being coupled to the received radio frequency energy for transmission to said detector by said directional coupler, said coupler comprising, a first coaxial transmission line within a second coaxial transmission line, said first and second coaxial transmission lines having a common cylindrical conductor, said radio frequency power being transmitted by said first line and said local oscillator power being transmitted by said second line, a plurality of openings of predetermined size in said common cylindrical conductor, said openings being positioned to couple a proper amount of said local oscillator power into said first line for transmission to said detector, said openings being disposed to cause cancellation of all local oscillator power being transmitted in the direction of said incoming radio frequency power, a reference cavity coupled to said second line and a matching pad, said pad located within said second line and comprising a cylindrical attenuating sleeve, said sleeve being fitted within said outer line and supported by a dielectric member upon said common cylindrical conductor, said pad affording a matched impedance load for said local oscillator and a matched impedance load for said reference cavity thereby effectively isolating each from the other and thereby increasing the frequency stability of both said oscillator and said reference cavity.

2. In a radio frequency energy receiver, a local oscillator mixer circuit for a guided wave transmission line comprising, a local oscillator, a detector, means for coupling the output of said local oscillator and the received radio frequency energy to said detector, said means comprising a first coaxial transmission line within a second coaxial transmission line, said first and second coaxial transmission lines having a common cylindrical conductor, said radio frequency power being transmitted by one of said coaxial lines and said local oscillator power being transmitted by the other of said coaxial lines, a plurality of openings positioned in said common cylindrical conductor for coupling of the proper amount of said local oscillator power to said incoming radio frequency power for transmission to said detector, said openings being disposed to cause cancellation of said local oscillator power being transmitted in the direction of said incoming radio frequency power, a reference cavity and attenuating means incorporated within said coupling means providing a matched impedance for said local oscillator and a matched impedance for said reference cavity whereby said local oscillator is isolated from said reference cavity.

3. Apparatus as in claim 2 wherein said attenuating means for isolating said local oscillator from said reference cavity comprises, a matching pad, said pad comprising an annular disk of electromagnetic energy absorptive material having a dielectric liner secured to said common conductor between said oscillator and said cavity and providing a matched impedance load for said local oscillator and a matched load for said reference cavity thereby effectively isolating each from the other and substantially increasing the frequency stability of both said oscillator and said reference cavity.

4. Means for coupling radio frequency energy and local oscillator energy to a detector and a reference cavity comprising an outer conductor, an intermediate conductor and an inner conductor, all substantially coaxial, said outer and intermediate conductors forming a coaxial transmission line adapted to be coupled to said radio frequency and said local oscillator energy sources, said intermediate and inner conductors forming a coaxial line adapted to be coupled to said detector and said reference cavity, first and second apertures cut in said intermediate conductor and axially spaced a distance equal to an odd number of quarter wave lengths, a matching pad comprising a sleeve of attenuating material attached to the inner surface of said outer conductor, said sleeve being supported by a dielectric member of less length attached to the outer surface of said intermediate conductor whereby to provide a matched load for said local oscillator and said reference cavity.

5. In a directional coupler an outer conductor, an intermediate conductor, and an inner conductor, all substantially coaxial, said outer and intermediate conductors forming a coaxial transmission line adapted to be coupled to a local oscillator and to a reference cavity, said intermediate and inner conductors forming a coaxial transmission line adapted to be coupled to a source of radio frequency energy and to a detector, means providing a matched load for both said local oscillator and said reference cavity for effectively isolating each from the other comprising a sleeve of attenuating material fitted to the inner surface of said outer conductor and a dielectric member of less length than said sleeve attached to the inner surface of said sleeve and the outer surface of said inner conductor.

6. A directional coupler comprising three coaxial conductors, the outer and intermediate conductors forming a first coaxial line and the intermediate and inner conductors forming a second coaxial line, openings in said intermediate conductor axially spaced an odd multiple of quarter wave lengths to cause cancellation of unwanted energy coupled between said coaxial lines, and means providing a matched load for an input and output of said first coaxial line comprising a sleeve of attenuating material fitted to the inner surface of said outer conductor and a dielectric member of less length than said sleeve interposed between the inner surface of said sleeve and the outer surface of said intermediate conductor.

References Cited in the file of this patent

UNITED STATES PATENTS

| | | |
|---|---|---|
| 2,423,390 | Korman | July 1, 1948 |
| 2,455,657 | Cork et al. | Dec. 7, 1948 |
| 2,605,400 | McClain | July 29, 1952 |
| 2,705,305 | Bailey | Mar. 29, 1955 |